United States Patent
Hirata

(10) Patent No.: US 10,872,758 B2
(45) Date of Patent: *Dec. 22, 2020

(54) SIC WAFER PRODUCING METHOD

(71) Applicant: DISCO CORPORATION, Tokyo (JP)

(72) Inventor: Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 213 days.

This patent is subject to a terminal disclaimer.

(21) Appl. No.: 15/962,685

(22) Filed: Apr. 25, 2018

(65) Prior Publication Data

US 2018/0308679 A1  Oct. 25, 2018

(30) Foreign Application Priority Data

Apr. 25, 2017 (JP) ................. 2017-086074

(51) Int. Cl.

| H01L 21/02 | (2006.01) |
|---|---|
| B23K 26/53 | (2014.01) |
| B23K 26/352 | (2014.01) |
| B24B 7/22 | (2006.01) |
| C30B 29/36 | (2006.01) |

(Continued)

(52) U.S. Cl.
CPC .... *H01L 21/02013* (2013.01); *B23K 26/3576* (2018.08); *B23K 26/53* (2015.10); *B24B 7/228* (2013.01); *C30B 29/36* (2013.01); *C30B 33/02* (2013.01); *H01L 29/1608* (2013.01)

(58) Field of Classification Search
CPC ........... H01L 21/02013; H01L 29/1608; H01L 21/0405; H01L 21/02008; B24B 7/228; B23K 26/3576; B23K 26/53; C30B 33/02
See application file for complete search history.

(56) References Cited

U.S. PATENT DOCUMENTS 7,642,174 B2 * 1/2010 Kobayashi ........... B28D 5/0011
  438/463
9,452,495 B1 * 9/2016 Hashimoto ............ B23K 26/38
(Continued)

FOREIGN PATENT DOCUMENTS

| JP | 2000094221 A | 4/2000 |
| JP | 2013049161 A | 3/2013 |

OTHER PUBLICATIONS

Grit chart by standards (from https://www.gritomatic.com/pages/grit-chart) (Year: 2019).*

(Continued)

*Primary Examiner* — Leith S Shafi
*Assistant Examiner* — Inja Song
(74) *Attorney, Agent, or Firm* — Greer Burns & Crain Ltd.

(57) ABSTRACT

A SiC wafer is produced from a single crystal SiC ingot. A focal point of a pulsed laser beam having a transmission wavelength to the ingot is set inside the ingot at a predetermined depth from a flat surface of the ingot, the predetermined depth corresponding to the thickness of the wafer to be produced. The pulsed laser beam is applied to the ingot to thereby form a separation layer for separating the wafer from the ingot. The wafer is separated from the ingot along the separation layer, and a flat surface is formed by grinding an upper surface of the ingot as a rough separation surface left after separating the wafer, thereby removing the roughness of the upper surface of the ingot to flatten the upper surface of the ingot.

5 Claims, 7 Drawing Sheets

(51) Int. Cl.
*C30B 33/02* (2006.01)
*H01L 29/16* (2006.01)

(56) References Cited

U.S. PATENT DOCUMENTS

| | | | |
|---|---|---|---|
| 10,094,047 B2* | 10/2018 | Hirata | B28D 1/221 |
| 2013/0248500 A1* | 9/2013 | Shreter | B28D 5/0011 |
| | | | 219/121.67 |
| 2016/0074960 A1* | 3/2016 | Hirata | C30B 33/06 |
| | | | 225/2 |
| 2016/0218003 A1* | 7/2016 | Hirooka | H01L 21/02236 |
| 2017/0053831 A1* | 2/2017 | Hirata | H01L 21/78 |

OTHER PUBLICATIONS

Grit number and particle size conversion chart (from http://www.graystarllc.com/reference-material) (Year: 2009).*

* cited by examiner

SIC WAFER PRODUCING METHOD

BACKGROUND OF THE INVENTION

Field of the Invention

The present invention relates to an SiC wafer producing method for producing an SiC wafer from a single crystal SiC ingot.

Description of the Related Art

Various devices such as integrated circuits (ICs), large scale integrations (LSIs), and light-emitting diodes (LEDs) are formed by forming a functional layer on the front side of a wafer formed of Si (silicon) or $A_2O_3$ (sapphire) and partitioning this functional layer into a plurality of separate regions along a plurality of division lines. Further, power devices or optical devices such as LEDs are formed by forming a functional layer on the front side of a wafer formed of single crystal SiC (silicon carbide) and partitioning this functional layer into a plurality of separate regions along a plurality of division lines. The division lines of such a wafer having these devices are processed by a processing apparatus such as a cutting apparatus and a laser processing apparatus to thereby divide the wafer into a plurality of individual device chips individually corresponding to the devices. The device chips thus obtained are used in various electrical equipment such as mobile phones and personal computers.

In general, the wafer on which the devices are to be formed is produced by slicing a cylindrical ingot with a wire saw. Both sides of the wafer sliced from the ingot are polished to a mirror finish (see Japanese Patent Laid-Open No. 2000-94221, for example). However, when the ingot is cut by the wire saw and both sides of each wafer are polished to obtain the product, a large proportion (70% to 80%) of the ingot is discarded to cause a problem of poor economy. In particular, a single crystal SiC ingot has high hardness and it is therefore difficult to cut this ingot with the wire saw. Accordingly, considerable time is required for cutting of the ingot, causing a reduction in productivity. Furthermore, since this ingot is high in unit price, there is a problem in efficiently producing a wafer in this related art.

A technique for solving this problem has been proposed (see Japanese Patent Laid-Open No. 2013-49161, for example). This technique includes the steps of setting the focal point of a laser beam having a transmission wavelength to single crystal SiC inside a single crystal SiC ingot, next applying the laser beam to the SiC ingot as scanning the laser beam on the SiC ingot to thereby form modified layers in a separation plane previously set inside the SiC ingot, and next breaking the SiC ingot along the separation plane where the modified layers have been formed, thus separating an SiC wafer from the SiC ingot.

SUMMARY OF THE INVENTION

However, when the wafer is separated from the ingot, the separation surface of the ingot along which the wafer has been separated becomes a rough surface. Accordingly, in next producing another wafer from the remaining ingot, the rough separation surface must be ground by an amount beyond the height of the roughness of the separation layer, so as to set the focal point of the laser beam at a proper position inside the remaining ingot. Thus, the separation surface of the remaining ingot is largely ground to be flattened, causing another problem of poor economy.

It is therefore an object of the present invention to provide an SiC wafer producing method which can produce an SiC wafer from a single crystal SiC ingot more economically.

In accordance with an aspect of the present invention, there is provided an SiC wafer producing method for producing an SiC wafer from a single crystal SiC ingot, the SiC wafer producing method including a separation layer forming step of setting a focal point of a pulsed laser beam having a transmission wavelength to the single crystal SiC ingot inside the SiC ingot at a predetermined depth from a flat surface of the SiC ingot, the predetermined depth corresponding to a thickness of the SiC wafer to be produced, and next applying the pulsed laser beam to the SiC ingot to thereby form a separation layer for separating the SiC wafer from the SiC ingot, a wafer separating step of separating the SiC wafer from the SiC ingot along the separation layer after performing the separation layer forming step, and a flat surface forming step of grinding an upper surface of the SiC ingot as a rough separation surface left after separating the SiC wafer in the wafer separating step, thereby removing the roughness of the upper surface of the SiC ingot to flatten the upper surface of the SiC ingot. The flat surface forming step includes a first grinding step of performing coarse grinding to the upper surface of the SiC ingot to thereby partially remove the roughness of the upper surface of the SiC ingot, and a second grinding step of performing fine grinding to the upper surface of the SiC ingot after performing the first grinding step, thereby completely removing the roughness of the upper surface of the SiC ingot to flatten the upper surface of the SiC ingot.

Preferably, the first grinding step is performed by using a first abrasive member containing diamond abrasive grains having a grain size of #1000 to #2000, and the second grinding step is performed by using a second abrasive member containing diamond abrasive grains having a grain size of #7000 to #8000. Preferably, 70% to 90% of the roughness of the upper surface of the SiC ingot is ground in the first grinding step, and 10% to 30% of the roughness of the upper surface of the SiC ingot is ground in the second grinding step.

Preferably, the SiC ingot has a first surface as the flat surface, a second surface opposite to the first surface, a c-axis extending from the first surface to the second surface, and a c-plane perpendicular to the c-axis, the c-axis being inclined by an off angle with respect to a normal to the first surface, the off angle being formed between the c-plane and the first surface. The separation layer forming step includes a modified layer forming step of setting the focal point of the pulsed laser beam inside the SiC ingot at the predetermined depth from the first surface, and next applying the pulsed laser beam to the SiC ingot as relatively moving the SiC ingot and the focal point in a first direction perpendicular to a second direction where the off angle is formed, thereby forming a linear modified layer inside the SiC ingot at the predetermined depth so as to extend in the first direction and cracks extending from the modified layer in opposite directions along the c-plane, the modified layer being formed in such a manner that SiC is decomposed into Si and C by the pulsed laser beam first applied, and the pulsed laser beam next applied is absorbed by C previously produced to continue the decomposition of SiC into Si and C in a chain reaction manner with the relative movement of the SiC ingot and the focal point in the first direction, and an indexing step of relatively moving the SiC ingot and the focal point in the second direction by a predetermined index amount, the modified layer forming step and the indexing step being repeated plural times to thereby form the separation layer inside the SiC ingot in the condition where a plurality of linear modified layers are arranged at given intervals in the second direction so as to be connected through the cracks.

According to the present invention, the amount of the single crystal SiC ingot to be discarded by grinding can be suppressed, so that the SiC wafer can be produced from the single crystal SiC ingot more economically.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
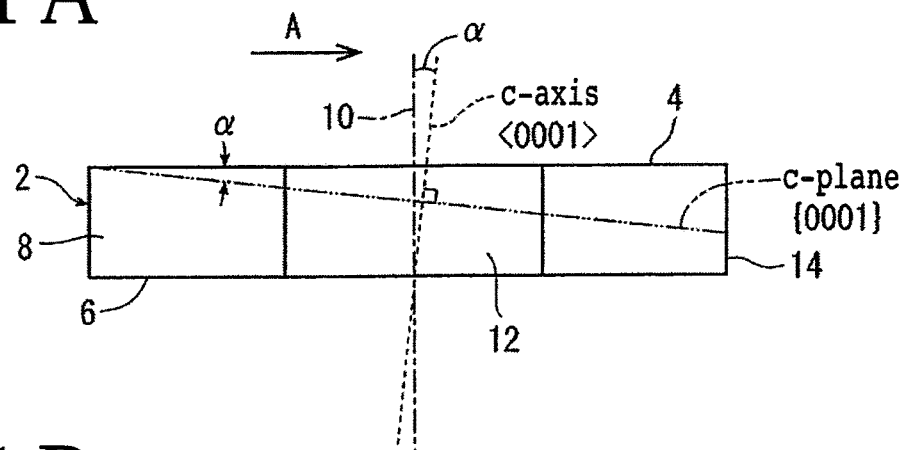
FIG. 1A is an elevational view of a single crystal SiC ingot.
Figure 1B:
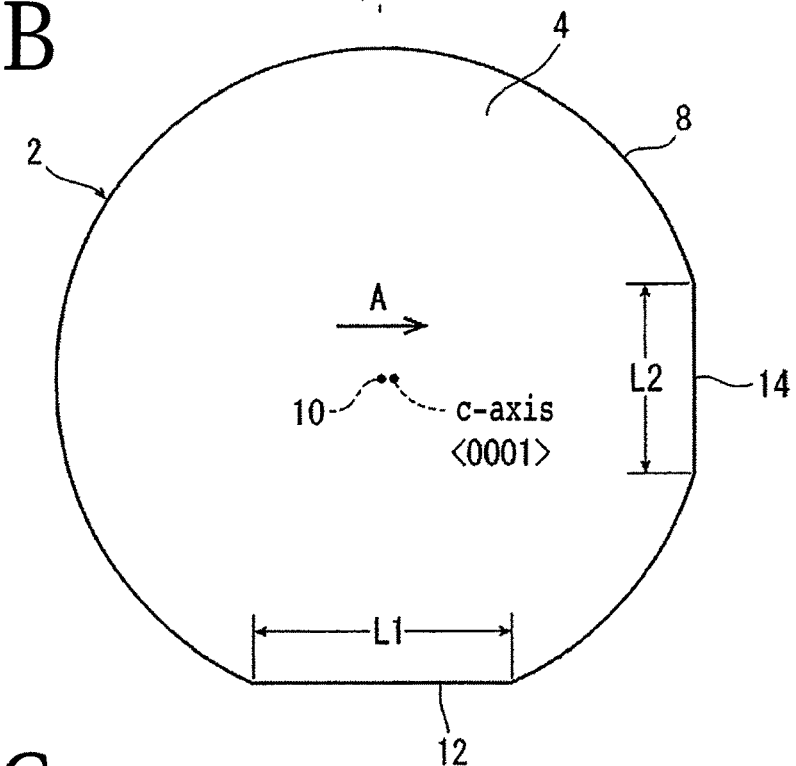
FIG. 1B is a plan view of the SiC ingot shown in FIG. 1A.
Figure 1C:
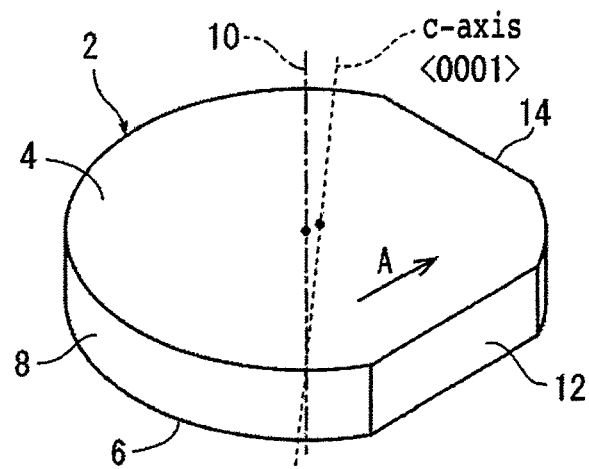
FIG. 1C is a perspective view of the SiC ingot shown in FIG. 1A.

A preferred embodiment of the SiC wafer producing method according to the present invention will now be described with reference to the drawings. FIGS. 1A to 1C show a substantially cylindrical, hexagonal single crystal SiC ingot 2 (which will be hereinafter referred to simply as "ingot 2") as a workpiece to be processed. The ingot 2 has a substantially circular first surface 4 as a flat surface, a substantially circular second surface 6 opposite to the first surface 4, a substantially cylindrical surface 8 formed so as to connect the first surface 4 and the second surface 6, a c-axis (<0001>direction) extending from the first surface 4 to the second surface 6, and a c-plane ({0001} plane) perpendicular to the c-axis. In the ingot 2, the c-axis is inclined by an off angle α (e.g., α=1, 3, or 6 degrees) with respect to a normal 10 to the first surface 4. The off angle α is formed between the c-plane and the first surface 4. The direction of formation of the off angle α (i.e., the direction of inclination of the c-axis) is shown by an arrow A in FIGS. 1A to 1C. Further, the cylindrical surface 8 of the ingot 2 is formed with a first orientation flat 12 and a second orientation flat 14, which are rectangular as viewed in side elevation and function to indicate crystal orientation. The first orientation flat 12 is parallel to the direction A of formation of the off angle α, and the second orientation flat 14 is perpendicular to the direction A of formation of the off angle α. As shown in FIG. 1B, which is a plan view taken in the direction of extension of the normal 10, a length L2 of the second orientation flat 14 is set shorter than a length L1 of the first orientation flat 12 (L2<L1).

Figure 2A:
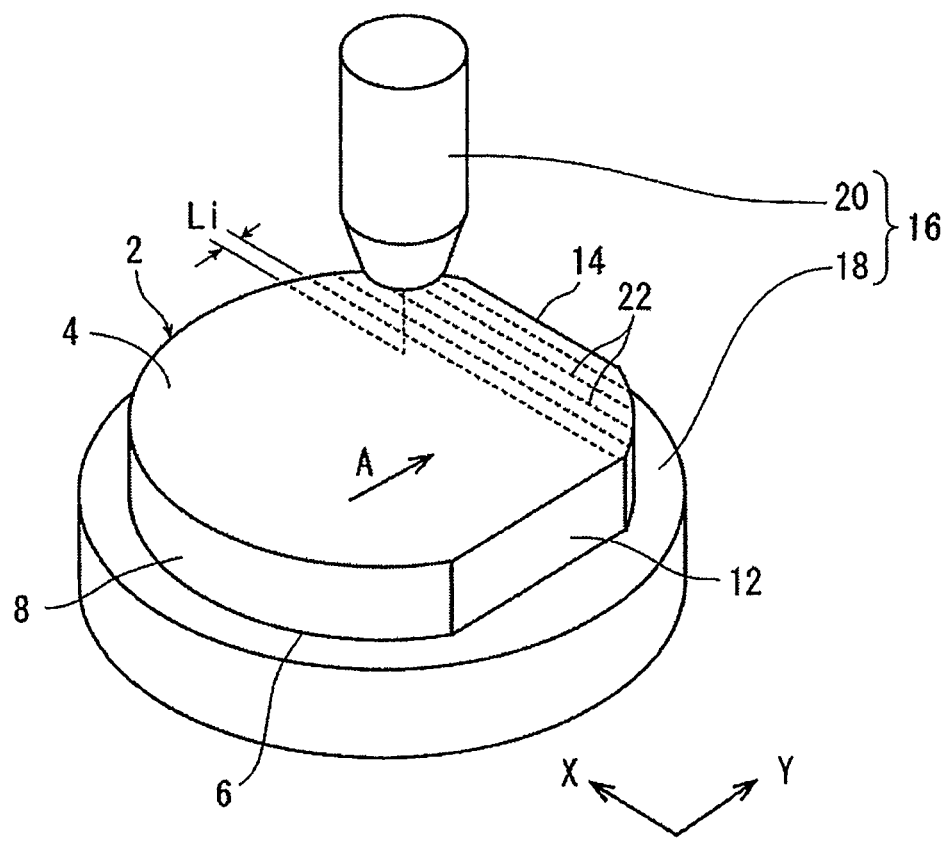
FIG. 2A is a perspective view showing a separation layer forming step.

In this preferred embodiment, a separation layer forming step is first performed to set a focal point of a pulsed laser beam having a transmission wavelength to the ingot 2 inside the ingot 2 at a predetermined depth from the flat surface (first surface 4) of the ingot 2, the predetermined depth corresponding to the thickness of a SiC wafer to be produced, and next applying the pulsed laser beam to the ingot 2 to thereby form a separation layer for separating the SiC wafer from the ingot 2. The separation layer forming step may be performed by using a laser processing apparatus 16, a part of which is shown in FIG. 2A. The laser processing apparatus 16 includes a chuck table 18 for holding a workpiece and focusing means 20 for applying a pulsed laser beam LB to the workpiece held on the chuck table 18. The chuck table 18 has an upper surface for holding the workpiece thereon under suction. The chuck table 18 is adapted to be rotated about a vertical axis by rotating means (not shown). Further, the chuck table 18 is adapted to be moved both in an X direction by X moving means (not shown) and in a Y direction by Y moving means (not shown). The focusing means 20 includes a focusing lens (not shown) for focusing a pulsed laser beam LB oscillated from a pulsed laser oscillator (not shown) included in the laser processing apparatus 16, wherein the pulsed laser beam LB focused by the focusing lens is applied to the workpiece held on the upper surface of the chuck table 18. The X direction is defined as the direction shown by an arrow X in FIG. 2A, and the Y direction is defined as the direction shown by an arrow Y in FIG. 2A, which is perpendicular to the X direction in an XY plane. The XY plane defined by the X direction and the Y direction is a substantially horizontal plane.

In the separation layer forming step, the ingot 2 is held under suction on the upper surface of the chuck table 18 of the laser processing apparatus 16 shown in FIG. 2A in the condition where the first surface 4 of the ingot 2 as the flat surface of the ingot 2 is oriented upward. As a modification, the ingot 2 may be fixed to the chuck table 18 in the condition where an adhesive (e.g., epoxy resin adhesive) is interposed between the second surface 6 of the ingot 2 and the upper surface of the chuck table 18. Thereafter, the ingot 2 is imaged by imaging means (not shown) included in the laser processing apparatus 16, from the upper side of the first surface 4 of the ingot 2 held on the chuck table 18. Thereafter, the X moving means, the Y moving means, and the rotating means of the laser processing apparatus 16 are operated to move and rotate the chuck table 18 according to the image of the ingot 2 detected by the imaging means, thereby adjusting the orientation of the ingot 2 to a predetermined orientation and also adjusting the positional relation between the ingot 2 and the focusing means 20 in the XY plane.

In adjusting the orientation of the ingot 2 to a predetermined orientation, the first orientation flat 12 is made parallel to the Y direction and the second orientation flat 14 is made parallel to the X direction as shown in FIG. 2A. Accordingly, the direction A of formation of the off angle α is made parallel to the Y direction, and the direction perpendicular to the direction A of formation of the off angle α is made parallel to the X direction.

Figure 2B:
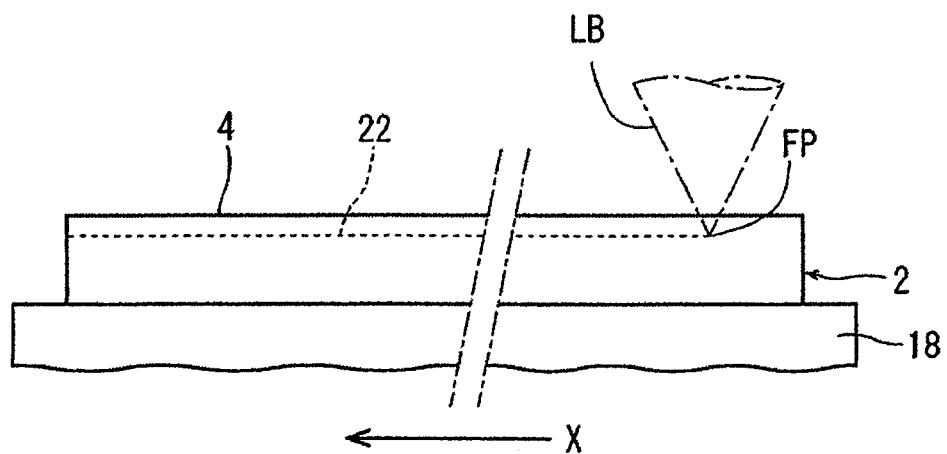
FIG. 2B is an elevational view showing the separation layer forming step.

Thereafter, focal position adjusting means (not shown) included in the laser processing apparatus 16 is operated to vertically move the focusing means 20, thereby setting a focal point FP at a predetermined depth from the first surface 4 of the ingot 2 as shown in FIG. 2B, wherein this predetermined depth corresponds to the thickness of an SiC wafer to be produced (which will be hereinafter referred to simply as "wafer"). Thereafter, a pulsed laser beam LB having a transmission wavelength to the ingot 2 is applied from the focusing means 20 to the ingot 2 as relatively moving the ingot 2 and the focal point FP in the X direction (i.e., in the direction perpendicular to the direction A of formation of the off angle α) (modified layer forming step). More specifically, in the modified layer forming step in this preferred embodiment, as shown in FIG. 2B, the pulsed laser beam LB is applied from the focusing means 20 to the ingot 2 as moving the chuck table 18 relative to the focal point FP at a predetermined feed speed in the X direction by operating the X moving means in the condition where the focal point FP is fixed in position.

Figure 3A:
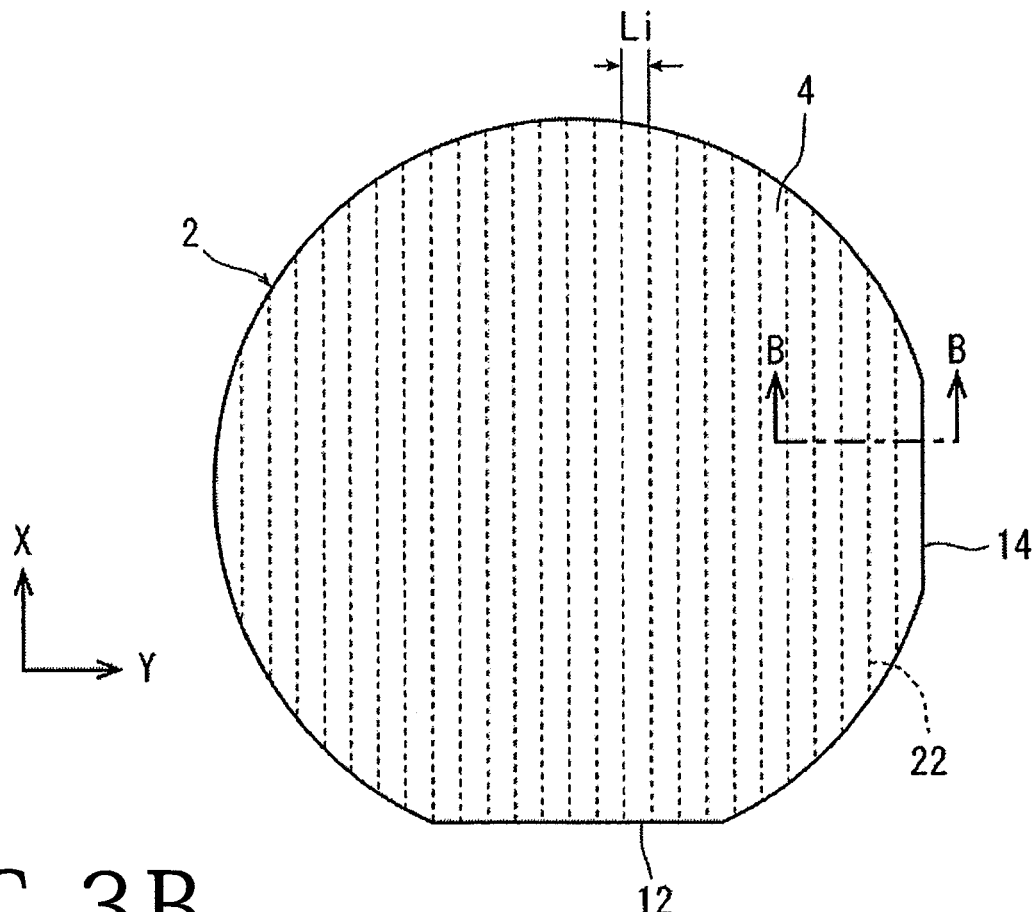
FIG. 3A is a plan view of the SiC ingot in the condition where a separation layer has been formed in the SiC ingot by performing the separation layer forming step.
Figure 3B:
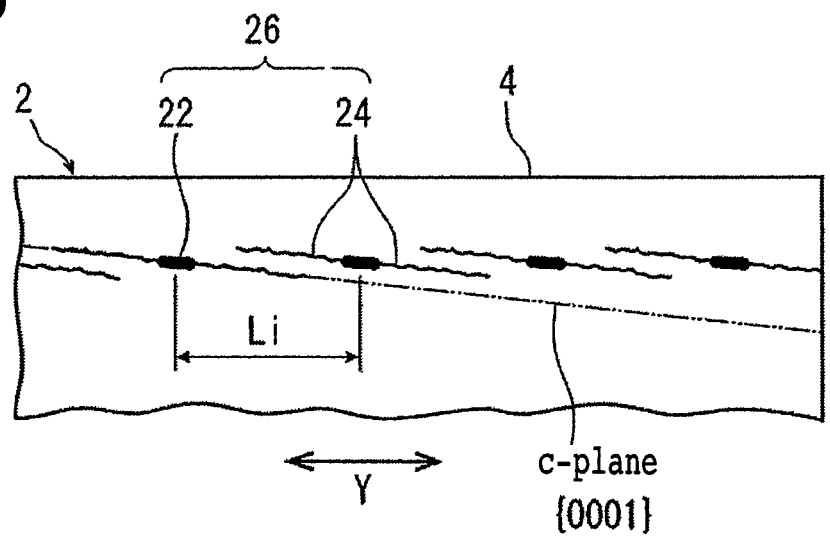
FIG. 3B is a cross section taken along the line B-B in FIG. 3A.

In the modified layer forming step, the pulsed laser beam LB is initially applied to the ingot 2 to thereby decompose SiC into Si (silicon) and C (carbon). Thereafter, the pulsed laser beam LB is next applied to the ingot 2 and absorbed by C previously produced. Thus, SiC is decomposed into Si and C in a chain reaction manner with the movement of the chuck table 18 in the X direction to thereby linearly form a modified layer 22 extending in the X direction as shown in FIGS. 3A and 3B. At the same time, cracks 24 are also formed so as to propagate from the modified layer 22 in opposite directions along the c-plane as shown in FIG. 3B. In the modified layer forming step, the chuck table 18 is fed in the X direction (the ingot 2 and the focal point FP are relatively moved in the X direction) so that the adjacent spots of the pulsed laser beam LB applied to the ingot 2 are overlapped with each other at the depth where the modified layer 22 is formed (i.e., a plurality of circular modified portions are overlapped with each other to form the linear modified layer 22). Accordingly, the pulsed laser beam LB is applied again to the modified layer 22 (to the circular modified portion previously formed) where SiC has been decomposed into Si and C.

In order to ensure that the adjacent spots of the pulsed laser beam LB are overlapped with each other in the modified layer forming step, the relation of $G=(V/F)-D<0$ must hold, where F is the repetition frequency of the pulsed laser beam LB, V is the relative speed between the ingot 2 and the focal point FP, and D is the diameter of each spot. Further, the overlap rate of the adjacent spots is defined as $|G|/D$.

After performing the modified layer forming step along a line in the X direction, an indexing step is performed in such a manner that the ingot 2 and the focal point FP are relatively moved by a predetermined index amount Li in the Y direction (i.e., in the direction A of formation of the off angle α). More specifically, in the indexing step in this preferred embodiment, the chuck table 18 is moved relative to the focal point FP by the predetermined index amount Li in the Y direction by operating the Y moving means in the condition where the focal point FP is fixed in position. Thereafter, the modified layer forming step and the indexing step are repeated plural times to thereby form a separation layer 26 inside the ingot 2 at the predetermined depth corresponding to the thickness of a wafer to be produced as shown in FIG. 3B, wherein the separation layer 26 is composed of plural modified layers 22 and cracks 24. In the separation layer 26, any adjacent ones of the plural modified layers 22 are connected through the cracks 24 in the direction A of formation of the off angle α. For example, the separation layer forming step is performed under the following processing conditions.

Figure 4:
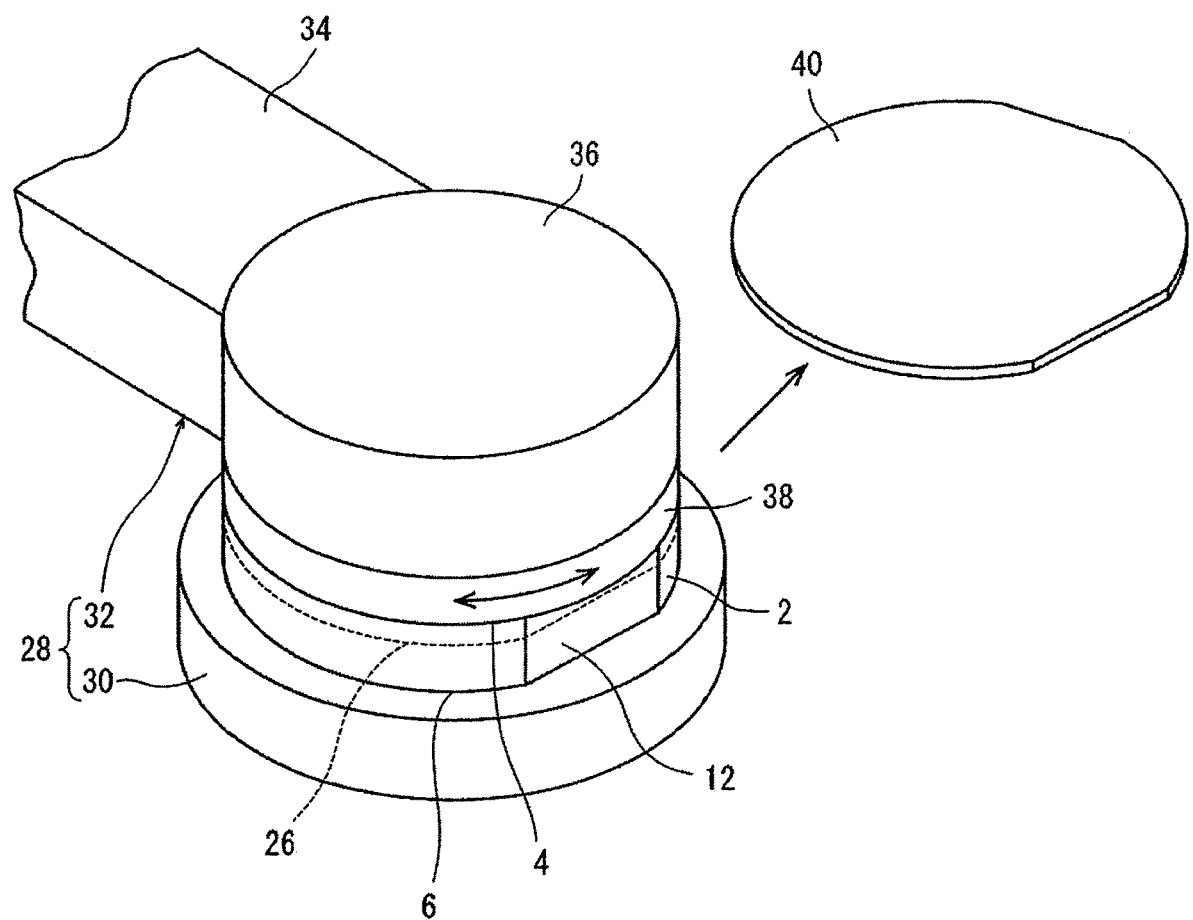
FIG. 4 is a perspective view showing a wafer separating step.

Wavelength of the pulsed laser beam: 1064 nm
Repetition frequency: 80 kHz
Average power 3.2 W
Pulse width 4 nanoseconds
Diameter of the focal point: 3 μm
Numerical aperture (NA) of the focusing lens: 0.43
Index amount: 250 to 400 μm
Feed speed: 120 to 260 mm/second
Position of the focal point: 300 μm from the flat surface of the single crystal SiC ingot After performing the separation layer forming step, a wafer separating step is performed to separate a wafer from the ingot 2 along the separation layer 26. The wafer separating step may be performed by using a separating apparatus 28, a part of which is shown in FIG. 4. The separating apparatus 28 includes a chuck table 30 for holding a workpiece and separating means 32 for separating a part of the workpiece held on the chuck table 30. The chuck table 30 has an upper surface for holding the workpiece thereon under suction. The separating means 32 includes an arm 34 extending in a substantially horizontal direction and a motor 36 provided at the front end of the arm 34. A disk-shaped suction member 38 is connected to the lower surface of the motor 36 so as to be rotatable about a vertical axis. The suction member 38 has a lower surface adapted to hold a workpiece under suction. Further, ultrasonic vibration applying means (not shown) is built in the suction member 38 to apply ultrasonic vibration to the lower surface of the suction member 38.

Figure 5A:
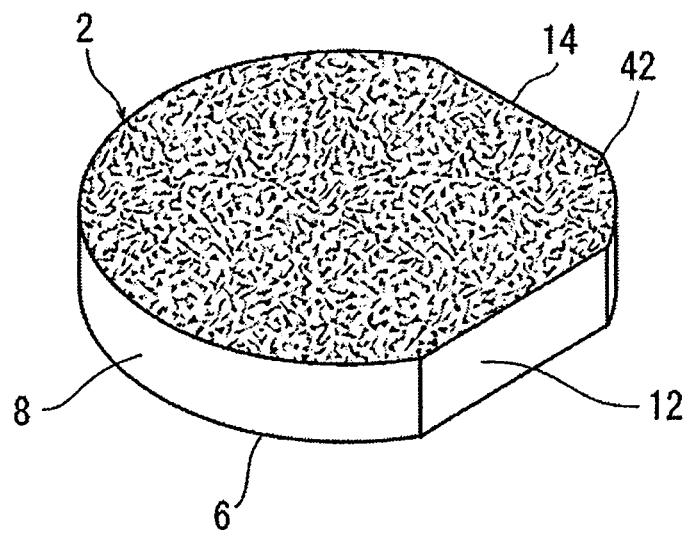
FIG. 5A is a perspective view of the SiC ingot left after separating an SiC wafer in the wafer separating step.
Figure 5B:
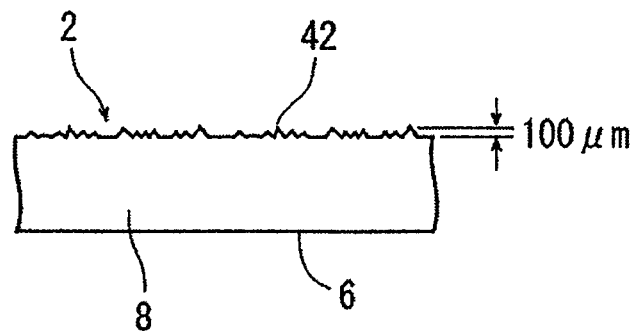
FIG. 5B is an elevational view of the SiC ingot shown in FIG. 5A.

In the wafer separating step, the ingot 2 is held under suction on the upper surface of the chuck table 30 of the separating apparatus 28 in the condition where the first surface 4 of the ingot 2 is oriented upward. As a modification, the ingot 2 may be fixed to the chuck table 30 in the condition where an adhesive (e.g., epoxy resin adhesive) is interposed between the second surface 6 of the ingot 2 and the upper surface of the chuck table 30. Thereafter, elevating means (not shown) included in the separating apparatus 28 is operated to lower the arm 34 until the lower surface of the suction member 38 comes into contact with the first surface 4 of the ingot 2, so that the first surface 4 of the ingot 2 is held by the lower surface of the suction member 38 under suction as shown in FIG. 4. Thereafter, the ultrasonic vibration applying means is operated to apply ultrasonic vibration to the lower surface of the suction member 38. At the same time, the motor 36 is operated to rotate the suction member 38. As a result, a part of the ingot 2 can be separated as a wafer 40 along the separation layer 26 as shown in FIG. 4. Further, as shown in FIGS. 5A and 5B, after separating the wafer 40 from the ingot 2, the ingot 2 has a rough upper surface 42 (separation surface). For example, the roughness of the rough upper surface 42 of the ingot 2 in the condition where the wafer 40 has been separated has a height of approximately 100 μm as shown in FIG. 5B.

After performing the wafer separating step, a flat surface forming step of grinding the upper surface 42 of the ingot 2 to remove the roughness of the upper surface 42, thereby flattening the upper surface 42. The flat surface forming step includes a first grinding step of performing coarse grinding to the upper surface 42 of the ingot 2 to thereby partially remove the roughness of the upper surface 42 and a second grinding step of performing fine grinding to the upper surface 42 of the ingot 2 after performing the first grinding step, thereby completely removing the roughness of the upper surface 42. From the viewpoint of reducing the time duration of the flat surface forming step, the amount of the roughness of the upper surface 42 to be removed in the first grinding step is preferably set greater than the amount of the roughness of the upper surface 42 to be removed in the second grinding step. For example, approximately 70% to 90% of the roughness of the upper surface 42 of the ingot 2 is preferably ground in the first grinding step, and approximately 10% to 30% of the roughness of the upper surface 42 of the ingot 2 is preferably ground in the second grinding step. More specifically, in the case that the height of the roughness of the upper surface 42 of the ingot 2 is 100 μm, approximately 80 μm of the roughness of the upper surface 42 of the ingot 2 is ground in the first grinding step, and approximately 20 μm of the roughness of the upper surface 42 of the ingot 2 is ground in the second grinding step, thereby finally flattening the upper surface 42 of the ingot 2. That is, a flat upper surface of the ingot 2 can be obtained by performing the first and second grinding steps after separating the wafer 40 from the ingot 2.

Figure 6A:
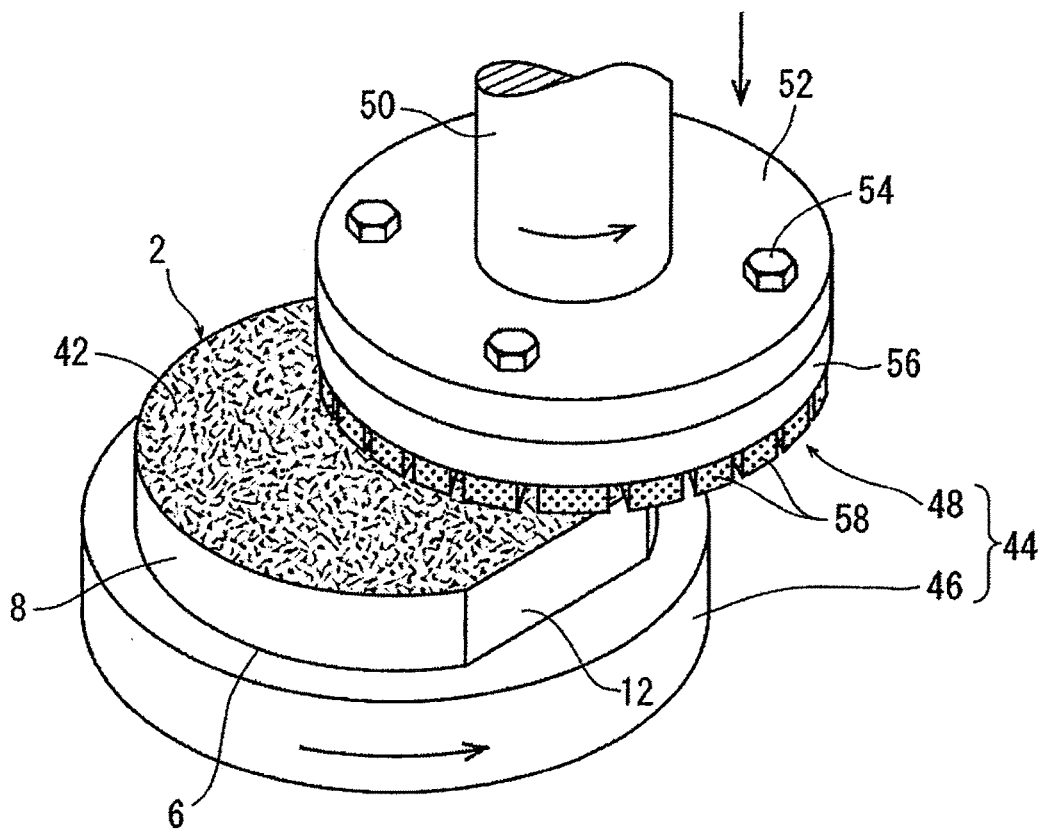
FIG. 6A is a perspective view showing a first grinding step constituting a flat surface forming step.
Figure 6B:
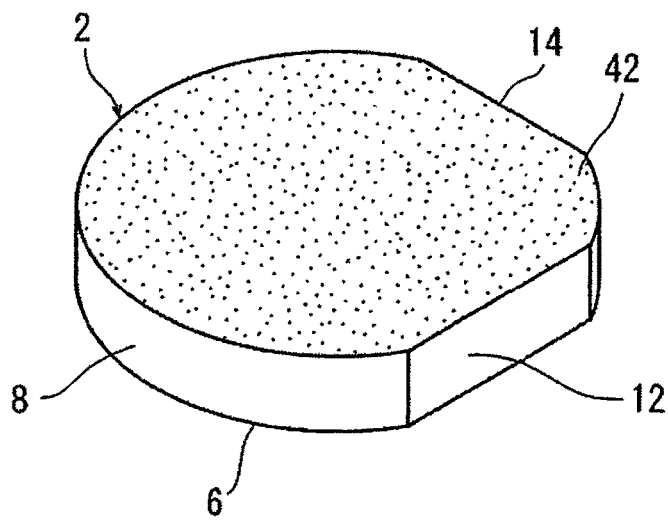
FIG. 6B is a perspective view of the SiC ingot processed by the first grinding step.

The first grinding step constituting the flat surface forming step may be performed by using a first grinding apparatus 44, a part of which is shown in FIG. 6A. The first grinding apparatus 44 includes a chuck table 46 for holding a workpiece and grinding means 48 for grinding the workpiece held on the chuck table 46. The chuck table 46 has an upper surface for holding the workpiece thereon under suction. The chuck table 46 is rotatable by rotating means (not shown) about a vertical axis. The grinding means 48 includes a cylindrical spindle 50 having a vertical axis of rotation, the spindle 50 being connected to a motor (not shown), and also includes a disk-shaped wheel mount 52 fixed to the lower end of the spindle 50. An annular grinding wheel 56 is fixed to the lower surface of the wheel mount 52 by bolts 54. A plurality of first abrasive members 58 are fixed to the lower surface of the grinding wheel 56 so as to be arranged annularly at given intervals along the outer circumference of the grinding wheel 56. Each first abrasive member 58 to be used in the first grinding step may be an abrasive member formed by binding diamond abrasive grins having a grain size of #1000 to #2000 with a vitrified bond at a concentration rate of 150. As shown in FIG. 6A, the center of rotation of the grinding wheel 56 is deviated from the center of rotation of the chuck table 46, so as to obtain a configuration such that the first abrasive members 58 annularly arranged pass through the center of rotation of the chuck table 46 as viewed in plan. Accordingly, when both the chuck table 46 and the grinding wheel 56 are rotated in the same direction and the first abrasive members 58 fixed to the grinding wheel 56 come into contact with the upper surface of the workpiece held on the upper surface of the chuck table 46, the upper surface of the workpiece can be entirely ground by the first abrasive members 58.

In the first grinding step of the flat surface forming step, the ingot 2 is held under suction on the upper surface of the chuck table 46 of the first grinding apparatus 44 shown in FIG. 6A in the condition where the upper surface 42 of the ingot 2 as a rough separation surface left after separating the wafer 40 is oriented upward. As a modification, the ingot 2 may be fixed to the chuck table 46 in the condition where an adhesive (e.g., epoxy resin adhesive) is interposed between the second surface 6 of the ingot 2 and the upper surface of the chuck table 46. Thereafter, the chuck table 46 is rotated by the rotating means at a predetermined speed (e.g., 300 rpm) in a counterclockwise direction as viewed in plan. Further, the spindle 50 is rotated by the motor at a predetermined speed (e.g., 6000 rpm) in a counterclockwise direction as viewed in plan. Thereafter, the spindle 50 is lowered by elevating means (not shown) included in the first grinding apparatus 44 until the first abrasive members 58 fixed to the grinding wheel 56 come into contact with the upper surface 42 of the ingot 2. Thereafter, the spindle 50 is further lowered at a predetermined feed speed (e.g., 0.1 μm/second) to thereby grind the upper surface 42 of the ingot 2 by a predetermined amount. Thus, the upper surface 42 of the ingot 2 can be coarsely ground to thereby partially remove the roughness of the upper surface 42.

Figure 7A:
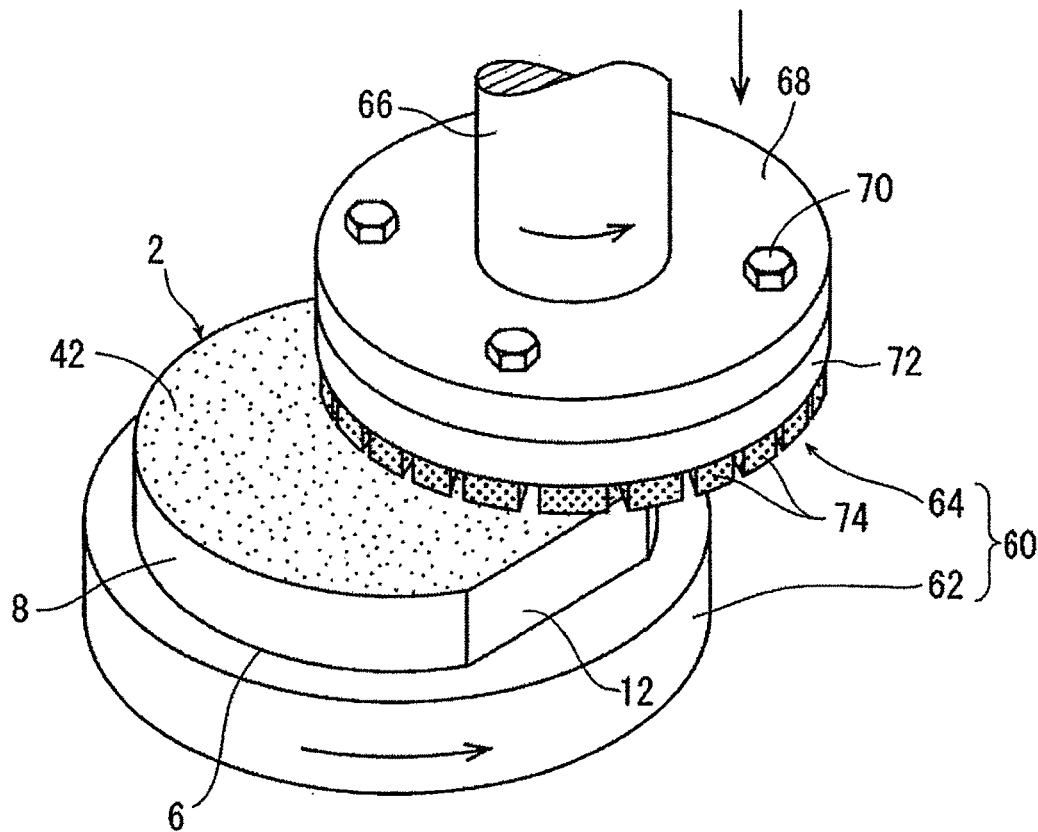
FIG. 7A is a perspective view showing a second grinding step in the flat surface forming step, wherein the second grinding step is performed after performing the first grinding step.
Figure 7B:
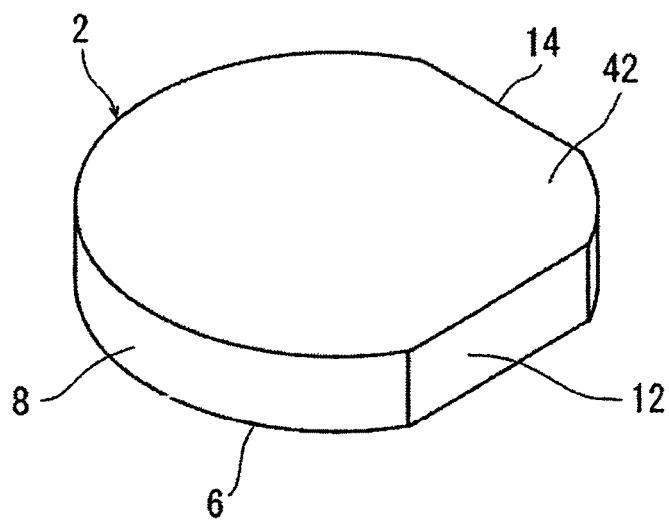
FIG. 7B is a perspective view of the SiC ingot processed by the second grinding step.

After performing the first grinding step of the flat surface forming step, the second grinding step constituting the flat surface forming step is performed in the following manner. The second grinding step constituting the flat surface forming step may be performed by using a second grinding apparatus 60, a part of which is shown in FIG. 7A. The second grinding apparatus 60 includes a chuck table 62 for holding a workpiece and grinding means 64 for grinding the workpiece held on the chuck table 62. The chuck table 62 has an upper surface for holding the workpiece thereon under suction. The chuck table 62 is rotatable by rotating means (not shown) about a vertical axis. The grinding means 64 includes a cylindrical spindle 66 having a vertical axis of rotation, the spindle 66 being connected to a motor (not shown), and also includes a disk-shaped wheel mount 68 fixed to the lower end of the spindle 66. An annular grinding wheel 72 is fixed to the lower surface of the wheel mount 68 by bolts 70. A plurality of second abrasive members 74 are fixed to the lower surface of the grinding wheel 72 so as to be arranged annularly at given intervals along the outer circumference of the grinding wheel 72. Each second abrasive member 74 to be used in the second grinding step may be an abrasive member formed by binding diamond abrasive grains having a grain size of #7000 to #8000 with a vitrified bond at a concentration rate of 150. Thus, the grain size of the abrasive grains of each second abrasive member 74 is set smaller than that of the abrasive grains of each first abrasive member 58. As shown in FIG. 7A, the center of rotation of the grinding wheel 72 is deviated from the center of rotation of the chuck table 62, so as to obtain a configuration such that the second abrasive members 74 annularly arranged pass through the center of rotation of the chuck table 62 as viewed in plan. This configuration is similar to that of the first grinding apparatus 44. Accordingly, when both the chuck table 62 and the grinding wheel 72 are rotated in the same direction and the second abrasive members 74 fixed to the grinding wheel 72 come into contact with the upper surface of the workpiece held on the upper surface of the chuck table 62, the upper surface of the workpiece can be entirely ground by the second abrasive members 74.

In the second grinding step of the flat surface forming step, the ingot 2 is held under suction on the upper surface of the chuck table 62 of the second grinding apparatus 60 shown in FIG. 7A in the condition where the upper surface 42 of the ingot 2 coarsely ground in the first grinding step is oriented upward. As a modification, the ingot 2 may be fixed to the chuck table 62 in the condition where an adhesive (e.g., epoxy resin adhesive) is interposed between the second surface 6 of the ingot 2 and the upper surface of the chuck table 62. Thereafter, the chuck table 62 is rotated by the rotating means at a predetermined speed (e.g., 300 rpm) in a counterclockwise direction as viewed in plan. Further, the spindle 66 is rotated by the motor at a predetermined speed (e.g., 6000 rpm) in a counterclockwise direction as viewed in plan. Thereafter, the spindle 66 is lowered by elevating means (not shown) included in the second grinding apparatus 60 until the second abrasive members 74 fixed to the grinding wheel 72 come into contact with the upper surface 42 of the ingot 2. Thereafter, the spindle 66 is further lowered at a predetermined feed speed (e.g., 0.05 μm/second) to thereby grind the upper surface 42 of the ingot 2 by a predetermined amount. Thus, the upper surface 42 of the ingot 2 can be finely ground to thereby completely remove the roughness of the upper surface 42. In this manner, the upper surface 42 of the ingot 2 can be flattened.

As described above, the flat surface forming step in this preferred embodiment includes the first grinding step of performing coarse grinding to the upper surface 42 of the ingot 2 to thereby partially remove the roughness of the upper surface 42 and the second grinding step of performing fine grinding to the upper surface 42 of the ingot 2 after performing the first grinding step, thereby completely removing the roughness of the upper surface 42. Accordingly, the amount of the ingot 2 to be discarded by the grinding can be suppressed, so that the wafer can be produced from the ingot 2 more economically.

In the above preferred embodiment, the ingot 2 and the focal point FP are relatively moved in the direction perpendicular to the direction A of formation of the off angle α in the modified layer forming step in the separation layer forming step, and the ingot 2 and the focal point FP are relatively moved in the direction A of formation of the off angle α in the indexing step in the separation layer forming step. As a modification, the direction of relative movement of the ingot 2 and the focal point FP in the modified layer forming step in the separation layer forming step may not coincide with the direction perpendicular to the direction A of formation of the off angle α, and the direction of relative movement of the ingot 2 and the focal point FP in the indexing step in the separation layer forming step may not coincide with the direction A of formation of the off angle α. Further, in the above preferred embodiment, the c-axis in the ingot 2 is inclined by the off angle α with respect to the normal 10 to the first surface 4, and the off angle α is formed between the c-plane and the first surface 4. As a modification, the c-axis may not be inclined with respect to the normal 10 to the first surface 4, and the off angle α between the c-plane and the first surface 4 may be 0 degree (i.e., the c-axis may coincide with the normal 10 to the first surface 4). That is, also in such a single crystal SiC ingot having a c-axis not inclined with respect to the normal to the flat surface of the ingot, the wafer producing method of the present invention can be applied.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A SiC wafer producing method for producing a SiC wafer from a single crystal SiC ingot, said SiC wafer producing method comprising:
a separation layer forming step of setting a focal point of a pulsed laser beam having a transmission wavelength to said single crystal SiC ingot inside said single crystal SiC ingot at a predetermined depth from a flat surface of said single crystal SiC ingot, said predetermined depth corresponding to a thickness of said SiC wafer to be produced, and next applying said pulsed laser beam to said single crystal SiC ingot to thereby form a separation layer for separating said SiC wafer from said single crystal SiC ingot;
a wafer separating step of separating said SiC wafer from said single crystal SiC ingot along said separation layer after performing said separation layer forming step;
a flat surface forming step of grinding an upper surface of said single crystal SiC ingot as a rough separation surface left after separating said SiC wafer in said wafer separating step, thereby removing the roughness of said upper surface of said single crystal SiC ingot to flatten said upper surface of said single crystal SiC ingot;
said flat surface forming step including
a first grinding step of performing grinding to said upper surface of said single crystal SiC ingot to thereby partially remove the roughness of said upper surface of said single crystal SiC ingot, and
a second grinding step of performing finer grinding than said first grinding step to said upper surface of said single crystal SiC ingot after performing said first grinding step, thereby completely removing the roughness of said upper surface of said single crystal SiC ingot to flatten said upper surface of said single crystal SiC ingot; and wherein
before said separation layer forming step, said single crystal SiC ingot has a first surface as said flat surface, a second surface opposite to said first surface, a c-axis extending from said first surface to said second surface, and a c-plane perpendicular to said c-axis, said c-axis being inclined by an off angle with respect to a normal to said first surface, said off angle being formed between said c-plane and said first surface; and wherein
said separation layer forming step includes:
a modified layer forming step of setting the focal point of said pulsed laser beam inside said single crystal SiC ingot at said predetermined depth from said first surface, and next applying said pulsed laser beam to said single crystal SiC ingot as relatively moving said single crystal SiC ingot and said focal point in a first direction perpendicular to a second direction where said off angle is formed, thereby forming a linear modified layer inside said single crystal SiC ingot at said predetermined depth so as to extend in said first direction and cracks extending from said modified layer in opposite directions along said c-plane, said modified layer being formed such that SiC is decomposed into Si and C by said pulsed laser beam first applied, and said pulsed laser beam next applied is absorbed by C previously produced to continue the decomposition of SiC into Si and C in a chain reaction manner with the relative movement of said single crystal SiC ingot and said focal point in said first direction, and
an indexing step of relatively moving said single crystal SiC ingot and said focal point in said second direction by a predetermined index amount, said modified layer forming step and said indexing step being repeated plural times to thereby form said separation layer inside said single crystal SiC ingot in the condition where a plurality of linear modified layers are arranged at given intervals in said second direction so as to be connected through said cracks.

2. The SiC wafer producing method according to claim 1, wherein

70% to 90% of the roughness of said upper surface of said single crystal SiC ingot is ground in said first grinding step, and the remaining roughness of said upper surface of said single crystal SiC ingot after said first grinding step is completed is completely ground in said second grinding step.

3. The SiC wafer producing method according to claim 2, wherein said first grinding step or said second grinding step or both, wherein a center of rotation of a grinding wheel is deviated from a center of rotation of a chuck table where said single crystal SiC ingot sits on.

4. The SiC wafer producing method according to claim 3, wherein said grinding wheel and said SiC wafer rotate in the same direction.

5. The SiC wafer producing method according to claim 1, wherein applying ultrasonic vibration and rotation to a top surface of said SiC wafer comprises:

contacting a rotatable disk-shaped suction member with said top surface;

applying ultrasonic vibration to said rotatable disk-shaped suction member; and rotating said rotatable disk-shaped suction member.

* * * * *